(12) United States Patent
Agarwal et al.

(10) Patent No.: US 10,804,255 B1
(45) Date of Patent: Oct. 13, 2020

(54) CIRCUIT FOR AND METHOD OF TRANSMITTING A SIGNAL IN AN INTEGRATED CIRCUIT DEVICE

(71) Applicant: Xilinx, Inc., San Jose, CA (US)

(72) Inventors: Sundeep Ram Gopal Agarwal, Hyderabad (IN); Ramakrishna K. Tanikella, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/409,175

(22) Filed: May 10, 2019

(51) Int. Cl.
*H01L 25/18* (2006.01)
*H03K 3/037* (2006.01)

(52) U.S. Cl.
CPC ............ *H01L 25/18* (2013.01); *H03K 3/037* (2013.01)

(58) Field of Classification Search
CPC combination set(s) only.
See application file for complete search history.

(56) References Cited

U.S. PATENT DOCUMENTS

| | | | |
|---|---|---|---|
| 5,428,299 A * | 6/1995 | Koshikawa | G11C 5/147 324/750.3 |
| 8,832,608 B1 * | 9/2014 | Chakrabarty | G06F 30/327 716/51 |
| 8,946,884 B2 | 2/2015 | Kwon | |
| 9,099,999 B1 * | 8/2015 | Wang | H01L 25/0657 |
| 9,153,292 B2 * | 10/2015 | Wu | H03K 19/1776 |
| 9,935,733 B1 | 4/2018 | Lesea | |
| 10,410,685 B2 * | 9/2019 | Oh | G06F 12/084 |
| 10,496,594 B1 * | 12/2019 | Miller | G06F 13/42 |
| 2005/0270074 A1 * | 12/2005 | Hardee | G11C 7/1096 327/112 |
| 2013/0336039 A1 * | 12/2013 | Frans | G11C 5/02 365/51 |
| 2014/0300379 A1 * | 10/2014 | Ryckaert | H01L 22/32 324/754.03 |
| 2015/0206824 A1 * | 7/2015 | Ramachandra | G11C 8/12 365/185.23 |
| 2015/0249602 A1 * | 9/2015 | Barner | H04L 45/245 370/389 |
| 2016/0013799 A1 * | 1/2016 | Li | G06F 1/12 327/115 |
| 2017/0358327 A1 * | 12/2017 | Oh | G06F 12/0893 |
| 2020/0026646 A1 * | 1/2020 | Lee | G06F 12/0868 |
| 2020/0049767 A1 * | 2/2020 | Kim | G01R 31/31725 |
| 2020/0075568 A1 * | 3/2020 | Ide | H03F 3/387 |

* cited by examiner

*Primary Examiner* — Adam D Houston
(74) *Attorney, Agent, or Firm* — John J. King

(57) ABSTRACT

A circuit for transmitting signals in an integrated circuit device is described. The circuit comprises a first die; a second die stacked on the first die; and a buffer transmitting data between the first die and the second die; wherein a first inverter of the buffer is on the first die, and a second inverter of the buffer is on the second die. A method of transmitting signals in an integrated circuit device is also described.

20 Claims, 7 Drawing Sheets

CIRCUIT FOR AND METHOD OF TRANSMITTING A SIGNAL IN AN INTEGRATED CIRCUIT DEVICE

TECHNICAL FIELD

The present invention relates generally to integrated circuit devices, and in particular, to a circuit for and a method of transmitting a signal in an integrated circuit device.

BACKGROUND

The implementation of integrated circuit devices continues to change with efforts to reduce the size, reduce the power, and increase the performance of integrated circuit devices. As with any product, there is always an effort to increase yield of integrated circuit devices during a manufacturing process. Recently, integrated circuit devices with multiple dies have been developed, where the multiple dies may be placed on an interposer that enables the communication of signals between the multiple dies. Other implementations of integrated circuit devices comprise multiple die that are stacked on top of one another, where the circuits on the stacked die may transmit signals by way of interconnect elements between the dies, such as through silicon vias (TSVs) for example.

However, during the manufacturing of stacked integrated circuit devices, there may be defects in the dies or in the connections between the dies, which may both reduce yield and affect performance.

Accordingly, there is a need for a circuit for and method of transmitting signals in an integrated circuit device having multiple dies that reduces problems associated with conventional devices.

SUMMARY

A circuit for transmitting signals in an integrated circuit device is described. The circuit comprises a first die; a second die stacked on the first die; and a buffer transmitting data between the first die and the second die; wherein a first inverter of the buffer is on the first die and a second inverter of the buffer is on the second die.

A method of transmitting signals in an integrated circuit device is also described. The method comprises providing a first die; stacking a second die to the first die; and transmitting data between the first die and the second die by way of a buffer; wherein a first inverter of the buffer is on the first die and a second inverter of the buffer is on the second die.

DETAILED DESCRIPTION

Figure 1:
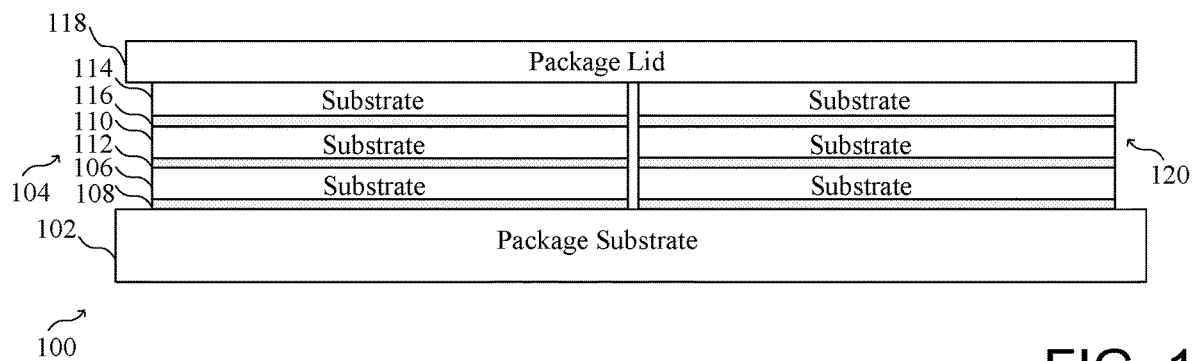
FIG. 1 is a block diagram of an exemplary stacked integrated circuit device.

Implementing multiple integrated circuit dies in an integrated circuit package can lead to increased density and improved performance. However, portions of the dies of the packaged integrated circuit device may be defective or may be unused. The stacking of dies, such as in active-on-active (AOA) devices, results in the closer proximity of circuits in the integrated circuit (IC) package, leading to improved performance. The stacked dies that are used in an integrated circuit package may be formed by stacking wafers, known as wafer-to-wafer bonding, and then dicing the stacked wafers to form individual stacked dies that are implemented in the integrated circuit package. However, because of wafer-on-wafer stacking before the dicing of the stacked wafers during the manufacturing process, it is not possible to stack 'known-good-die' in stacked die architectures. That is, there may be defects in the bonds between dies in a stack of dies or within a die itself that cannot be identified until after the stacked wafers are diced. As a result, defect tolerance and redundancy are beneficial. The circuits and methods for transmitting data in an integrated circuit device set forth below are beneficial for a redundancy scheme to be implemented in stacked die architectures.

The circuits and methods set forth below enable power gating required to switch off the current on a defective die or a portion of a defective die in a multi-die integrated circuit device, such as stacked Field Programmable Gate Array (FPGA) subsystems formed using wafer-to-wafer bonding. According to some implementations, the circuits and methods provide 3D stacked dies having dual power gated supplies, such as a higher voltage for memory devices (e.g. VGG) and a lower voltage for circuits such as logic circuits not requiring the higher voltage (e.g. VCCINT). Power gating reduces the static leakage of unused die. However, since the power gated and non-power gated regions can coexist on same die in some implementations, there could be spurious current paths between non-gated and gated regions. The use of isolation cells between ungated and gated regions stop these spurious current paths. The circuits and methods of splitting the inverters of a buffer provide isolation, where first inverter is on ungated supply region of circuit and second inverter is on gated supply which shares supply with gated region.

According to some implementations, an inverter of a driver may be split across two die, where one of the inverters, such as the second inverter of the buffer, may be supplied with a gated reference voltage. Accordingly, the power gated inverter acts as isolation cell between gated and ungated power supplies, and isolates a driver in an active die from source/drain loads in a defective die. The circuit arrangement has no area impact, but provides improvement in the implementation of die-die connections. That is, because it would necessary to have two inverters of a buffer on same die of a conventional device, splitting the inverters of the buffer between 2 dies, where the second inverter of a die of a conventional buffer arrangement would take up the area of inverter which moved to next die. Therefore, there is no area impact because an inverter that is used is essentially moved to another die.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Turning first to FIG. 1, a block diagram of an exemplary stacked integrated circuit device 100 is shown. More particularly, a substrate 102, shown here by way of example as a package substrate, is configured to receive a plurality of dies which are electrically connected by interconnect elements, as will be described in more detail in FIG. 2. Alternatively, the substrate could comprise an interposer that is positioned on a package substrate, or any other element used for receiving dies of an integrated circuit device. As shown in FIG. 1, a first stack of dies comprises a first substrate 106 having a corresponding interconnect layer 108 comprising interconnect elements that enable routing signals to the package substrate. The interconnect elements may comprise solder bumps, a hybrid interconnect technology, or any other conductive element for routing signals to and from the die, for example. A second substrate 110 has a corresponding interconnect layer 112 comprising interconnect elements that enable routing signals. A third substrate 114 has a corresponding interconnect layer 116 comprising interconnect elements that also enable routing signals. A package lid 118 may be included to cover the substrate 114 or encapsulate the plurality of dies. The substrate and interconnect layer pairs (106 and 108, 110 and 112, and 114 and 116) as shown form 3 die, and are configured to route signals between the die as will be described in more detail below in reference to FIG. 2. It should be understood that the arrangement of FIG. 1 is intended to show a general arrangement of stacked die by way of example, where specific arrangements of the dies could have different configurations of Face-to-Face dies (also known as active-on-active dies) and Face-to-Back dies, where face stands for a metal layer side back end-of-line (BEOL) and back stands for a substrate. The interconnect elements could include TSVs or BEOL metal layers of a die depending upon the configuration of the dies. For Face-to-Back bonding, the interconnections between the dies are implemented in substrate (i.e. where the TSVs are). According to one example, interconnect layer 112 may comprise metal layers (i.e. on a face) of substrate 110 (i.e. back), where the interconnect layer 112 and the die 110 that together make one die layer. The interconnections from one die to another die or between the substrate package and a die may include metal layers or TSVs depending upon the orientation of the dies. It should be noted that the stacked IC device may include different types of TSVs, such via-first TSVs that are fabricated before devices such as transistors, capacitors, or resistors for example are generate during a front end of line process, via-middle TSVs that are fabricated after the transistors, capacitors, or resistors devices are patterned but before the metal layers are formed in a back-end-of-line process, and via-last TSVs that are made during or after the back-end-of-line process. Via-middle TSVs are currently a common option for advanced 3D ICs as well as for interposer stacks.

The integrated circuit device may include additional sets of dies, including a second set of dies 120 which may be implemented in a similar manner as the set of dies 104, where the substrate 102 enables the communication of signals between the first set of die and the second set of die. While the exemplary stacked integrated circuit device 100 is shown by way of example, it should be understood other arrangements of dies could be implanted, including dies that are positioned adjacent to each other on a horizontal plane of the package substrate. Further, while examples of the circuits and methods are described in reference to stacked dies of an integrated circuit device, it should be understood that the circuits and methods could be implemented in dies that are adjacent to each other on a horizontal plane of a package substrate, wherein a die of the first set of dies 104 may communicate with a die of the second set of dies 120. According to one implementation, inverters of a buffer enabling the transfer of signals between dies are split between the dies, where a first inverter of the buffer is first side of a boundary between the first die and the second die, and a second inverter of the buffer is on a second side of the boundary between the first die and the second die. The boundary could be for example the top and bottom surfaces of two stacked dies. Alternatively, for an arrangement of die that are not stacked (e.g. dies that are on a horizontal plane of a substrate or interposer or dies of different sets of stacked dies on a horizontal plane), the boundary could include one of the top or bottom of one of the dies for example. For example, circuits and methods of splitting inverters of a buffer between 2 die could include an inverter of a buffer in a die of one stack of dies and the other inverter of the buffer in a die of another stack of dies, where the boundary comprises at least one of the top or bottom of one of the dies.

Figure 2:
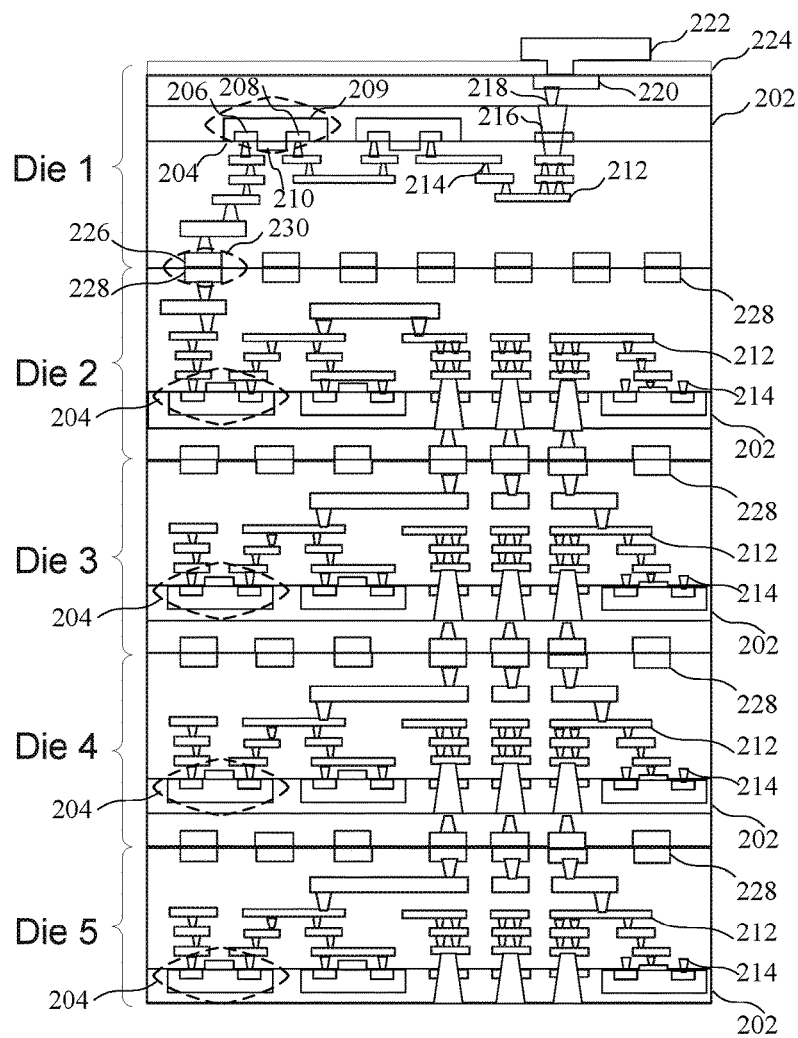
FIG. 2 is a cross-sectional view of a portion of an exemplary stacked integrated circuit device, such as the integrated circuit device of FIG. 1.

Turning now to FIG. 2, a cross-sectional view of a portion of an exemplary stacked integrated circuit device 200, which may be a cross-section of the integrated circuit device of FIG. 1 but having 5 dies, is shown. The stacked integrated circuit device 200 comprises a plurality of dies, shown here by way of example as Die 1-Die 5. Each of the die may generally comprise the same types of elements, such as active elements formed in silicon, metal traces and vias, which are designated in each of the die with the same reference numerals. For example, each die may comprise a substrate 202 having active elements 204, shown here by way of example as a transistor comprising a source 206 and a drain 208 in a well region 209, and a gate region 210.

The active elements of the substrate of a die are connected to one another and elements of other die by way of interconnect elements, which may comprise metal traces of metal layers separated by non-conductive layers and vias connecting portions of the metal layers through the non-conductive layers. More particularly, interconnect elements 212 are coupled together by vias 214 as shown. Vias 216 extending through the substrate, often referred to as through silicon vias (TSVs), extend from contact elements 218 on the backside of the substrate, which may be coupled to a contact element 220 that enables a connection to a contact pad 222 extending through an insulation layer 224 to provide an external connection. Other contact elements may also be implemented for providing an electrical connection between dies. For example, a first contact element 226 of a first die may be electrically coupled to a second contact element 228 of a second die, where the contact elements 226 and 228 may be a part of a hybrid contact element 230. The example of FIG. 2 is provided to show an example of a device in which the circuits of FIGS. 3 and 4, as described in more detail below, can be implemented.

The circuit of FIG. 2 is shown by way of example, and can include any number of dies, which can be implemented in any orientation. While a face-to-face arrangement of the dies are shown between die 1 and die 2 and a face-to-backside arrangement are shown in the connections of the other die, it should be understood that other orientations of the dies may be implemented. Some or all of the die may be the same type of device, such as a programmable logic device (PLD), or may have a specific function, such as a memory or logic, in the different die.

Figure 3:
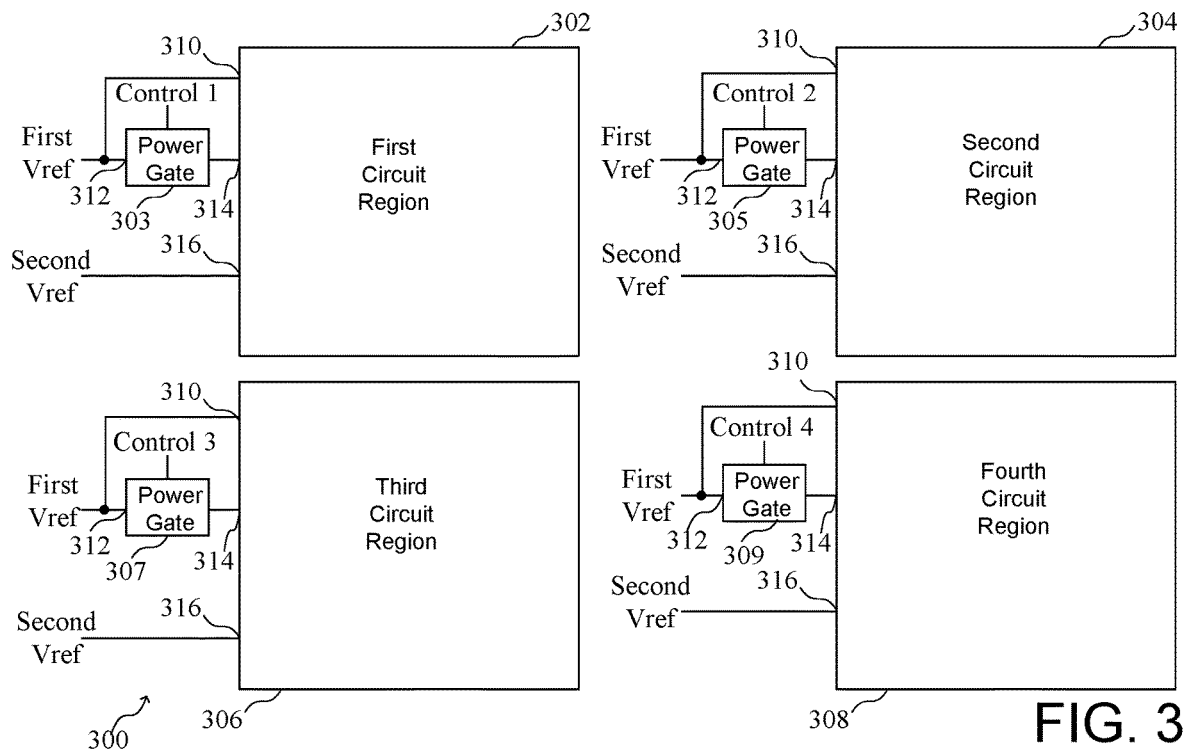
FIG. 3 is a block diagram of a portion of an integrated circuit having regions that receive power gated reference voltages.

Turning now to FIG. 3, a block diagram of a portion 300 of an integrated circuit having regions receiving power gated reference voltages is shown. The circuits and methods for transmitting signals can be implemented in any type of integrated circuit device. However, the circuits and methods are beneficial in integrated circuit devices having circuit elements that are dedicated to certain functions, and that are repeated, such as in the PLDs that are shown and described by way of example below in FIGS. 10 and 11.

According to the example of FIG. 3, a circuit may be divided into 4 regions, including a first circuit region 302 having a corresponding power gating circuit 303, a second circuit region 304 having a corresponding power gating region 305, a third power gating region 306 having a corresponding power gating circuit 307, and a fourth circuit region 308 having a corresponding power gating circuit 309. For each of the circuit regions, a first reference voltage (First Vref) is coupled to a first input 310 and an input 312 of the corresponding power gating circuit, a gated output of which is coupled to a second input 314 of the circuit region. As will be described in more detail below, a gated reference voltage corresponding to the first reference voltage is coupled to the circuit region in response to a corresponding control signal, designated Control 1-Control 4 in FIG. 3. A second reference voltage (Second Vref) is coupled to an input 316.

While the second reference voltage is not coupled to a corresponding power gaiting circuit, a second power gating circuit could be implemented between the second reference voltage and the input 316. According to one implementation, the first reference voltage could be a lower voltage (e.g. VCCINT) and the second reference voltage could be a higher voltage (e.g. VGG). While 4 regions are shown by way of example, it should be understood that any number of regions could be implemented, and any number of gated and non-gated reference voltages could be used. Further, a single reference voltage or more than 2 reference voltages could be implemented.

Figure 4:
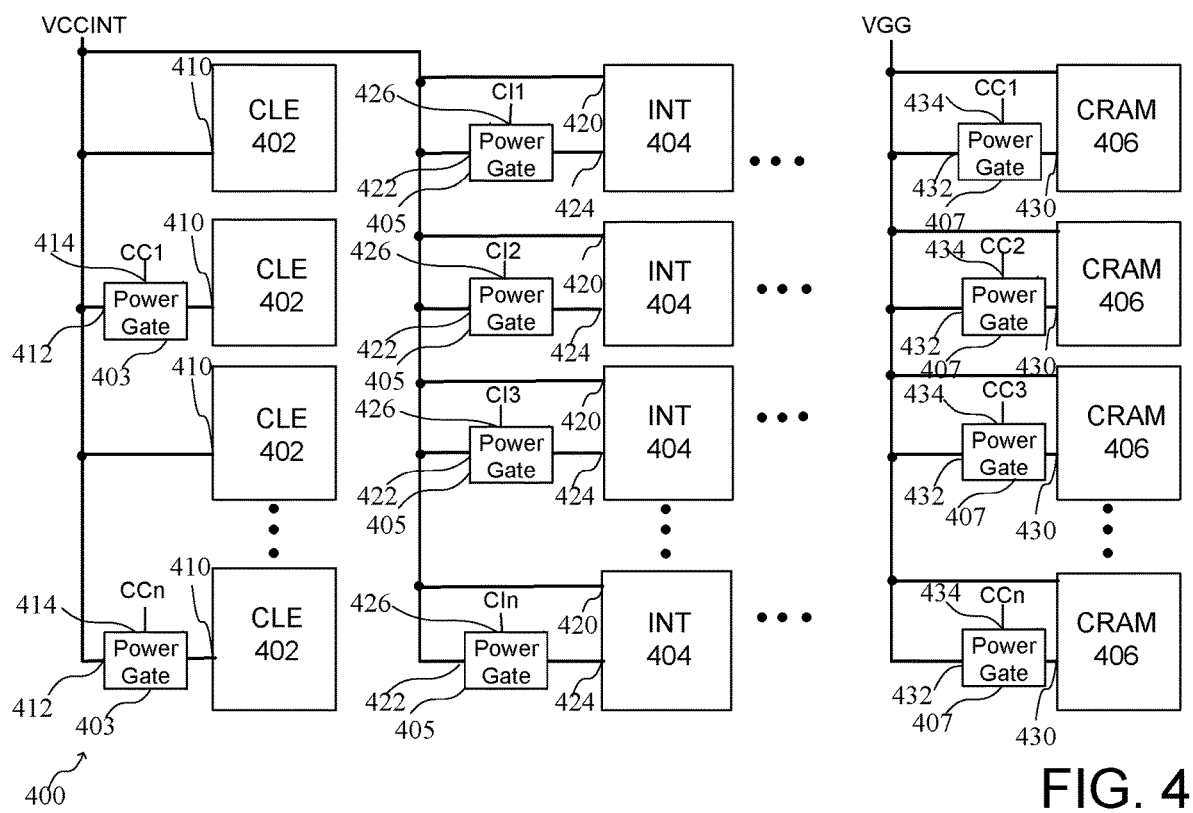
FIG. 4 is a block diagram of a portion of an integrated circuit having circuit blocks that receive power gated reference voltages.

Turning now to FIG. 4, a block diagram of a portion 400 of an integrated circuit arrangement having circuit blocks receiving power gated reference voltages is shown. The circuit arrangement of FIG. 4 includes configurable logic elements (CLEs) 402 having a corresponding power gating circuit 403, interconnect element blocks 404 having a corresponding power gating circuit 405, and configuration random access memory (CRAM) 406 having a corresponding power gating circuit 407. Details of the CLEs, interconnect element blocks and CRAMs will be described in more detail in reference to FIGS. 10 and 11.

According to the implementation of FIG. 4, some of the CLEs 402 are configured to receive a first reference voltage (e.g. VCCINT) at an input 410, while other CLEs may be configured to receive a gated first reference voltage at the input 410. More particularly, for the gated first reference voltage, the first reference voltage is coupled to an input 412 of the power gating circuit 403, which is also coupled to receive a CLE gating control signal (e.g. CC1 . . . CCn) at a control input 414. While the CLEs 402 receive only one reference voltage, gated or ungated, it should understood that the CLEs could be configured to each receive a gated and ungated voltage, and more than one gated and ungated voltage.

The circuit arrangement of FIG. 4 also includes a plurality of interconnect element blocks 404, shown by way of example as each receiving the first reference voltage and a gated first reference voltage. More particularly, the first reference voltage is provided to an input 420 of the interconnect block 404. The corresponding power gating circuit is also configured for each of the interconnect element blocks 404 to receive the reference voltage at an input 422 and generate a gated reference voltage coupled to an input 424 of the interconnect element block 404 in response to a corresponding control interconnect signal (CI1-CIn) coupled to a control input 426.

The circuit arrangement of FIG. 4 also includes a plurality of CRAM blocks 406, shown by way of example as each receiving a second reference voltage (VGG) and a gated second reference voltage (Gated VGG). More particularly, the corresponding power gating circuit 407 is configured for each of the CRAM blocks 406 to receive the second reference voltage (e.g. VGG) at an input 432 and generate a gated second reference voltage coupled to an input 430 of the CRAMs 406 in response to a corresponding CRAM control signal (CC1-CCn) at a control input 434. While the circuit arrangement of FIG. 4 includes 3 types of circuit blocks having different arrangements of power gating, it should be understood that the arrangement of FIG. 4 is provided by way of example, and different types of circuit blocks could be implemented with different power gating configurations.

In integrated circuit devices such as programmable logic devices with dual voltage supplies (e.g. memory cells may be supplied with a higher voltage supply (VGG) and the core may be supplied with a nominal voltage (VCCINT)), it may be beneficial to power gate VCCINT. Power gating of the higher voltage VGG may also be beneficial because some circuits (e.g. configuration random access memory (CRAM) cells which receive the higher voltage) can have a leakage in 7 nm technology that may be up to 15% of the total power of the IC device. Therefore, as will be described in more detail below, it may be beneficial to gate both the voltages on bad dies, not only to save static power but also to improve yield.

It should be noted that while gating power supplies is beneficial, some circuit needs to be on ungated supply to serve always-on blocks. For example, in 3D ICs, such as the integrated circuit device of FIGS. 1 and 2, when supplies of one of the defective die are power gated, it is still necessary to have active signals to propagate across the defective power gated die, which may have power gated loads on defective die (where signals between the die are generally referred to as z-signals (i.e. extending in the z direction between the stacked dies)). The transmission of signals to defective die may create spurious leakage paths from ungated supply to gated supply, and also result in indefinite dangling capacitance on power gated dies due to spurious leakage on paths that can have significant impact on performance. Therefore, isolation circuitry, which traditionally has been expensive and is undesirable in area limited FPGA interconnect block in conventional devices, is necessary. The arrangement of isolation circuitry of FIGS. 5 and 6 overcomes deficiencies of conventional isolation circuitry by spitting the inverters of a buffer between 2 die and therefore eliminating the need for additional circuitry.

The active z-signals (i.e. signals in the vertical direction between two stacked die) may be coupled to different types of loads, including loads on an adjacent die and loads across multiple dies. The circuits and methods set forth in FIGS. 5 and 6 overcome the problems of conventional devices by splitting the two-inverters of a buffer (i.e. driver) of an interconnect element of a die into two inverting stages, where a first inverter is on one die which includes a signal driver and second inverter on the second die which is a load die. The first inverter may be implemented using a non-power gated supply to enable the transfer of signals across multiple die, while the second inverter may be on a power gated supply. The second inverter receiving power gated supply serves as an isolation cell. Unlike conventional isolation cells that require circuits that are not otherwise necessary, the circuits and methods of splitting the driver provide finite load capacitance and improve performance of shared connections between dies, such as shared z-connection across dies.

That is, the circuits and methods provide an inverter connected to power-gated supply, which can be implemented at no additional circuit footprint due to the splitting technique and which improves performance over non-power gated solution. While the circuits and methods also enable full power gating of VGG which helps improving yield of product with additional power savings, the strategy of split inverters across dies can be used irrespective of power gating to improve performance of interconnect on 3D ICs.

Figure 5:
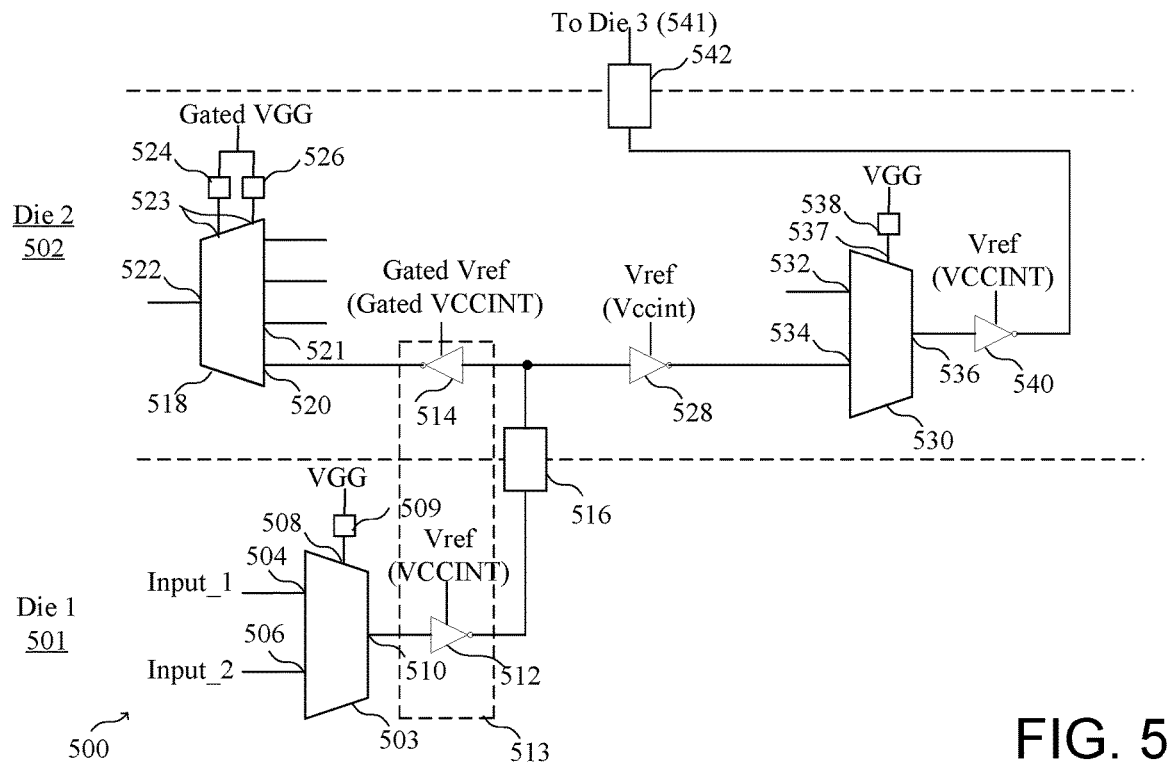
FIG. 5 is a block diagram of a portion of a circuit for transmitting signals between die of an integrated circuit device.

Turning now to FIG. 5, a block diagram of a portion of a circuit 500 for transmitting signals between stacked die of an integrated circuit device is shown. The circuit of FIG. 5 includes elements that are a part of 2 die, and more particularly, elements of a buffer associated with a driver on the first die 501 and the second die 502. The circuit 500 may include a first selection circuit 503, shown here by way of example as a multiplexer adapted to receive input signals (Input_1 and Input_2) at a first input 504 and a second input 506, wherein a control signal provided at an input and generated in response to memory element 509 enables generating a selected value (of the Input_1 and Input_2 signals) at an output 510. It should be noted that the memory element 509 could be a part of the CRAM, and receive a reference voltage (e.g. VGG) as described above in reference to FIG. 4. It should be noted that, while selection circuit 503 is configured to receive a selection signal for selecting an input of the selection circuit at an input 508 and selection circuit 530 is configured to receive a selection signal at an input 537 by way of a memory element that receives the VGG reference voltage, it should be understood that the memory elements could receive a different reference voltage that is not gated. That is, the selection circuits 503 and 530 are controlled by selection input signals that are always on to enable the transfer of signals between the die, such as between Die 1 and Die 3 even if Die 2 or a portion of Die 2 is defective for example. While the control signals are provided to the control inputs of the selection circuits by way of memory elements, it should be understood that the control signals could be provided by other circuit elements that enable the selection circuits 503 and 530 to be always on.

An output signal generated at the output 510 is coupled to a first inverter 512 of a buffer 513, an output of which is coupled to a second inverter 514 by way of an interconnect element 516. The first inverter 512 and the second inverter 514 are part of a buffer that is split between the first die and the second die. The interconnect element 516 could be any type of contact element that enables the transfer of signals between first inverter on the first die and the second inverter on the second die. By way of example, the interconnect element 516 could include elements of both die, such as contact pads, TSVs, metal traces, or elements of a hybrid bond element.

The second inverter 514 may be coupled to a selection circuit 518 at a first input 520 of a plurality of inputs. An output signal of the selection circuit 518 is generated at an output 522 in response to inputs at selection inputs 523. According to some implementations, the selection inputs 523 receive outputs of memory cells 524 and 526. The memory cells 524 and 526 may be a part of a CRAM that receives a gated reference voltage, such as a gated VGG voltage. By providing gating of the second inverter 514, it is possible to reduce leakage/spurious current from ungated to gated circuit regions. There are a number of leakage paths in the circuits of the integrated circuit device. For example, there may be a leakage path in a drive path of the Die 2, such as in a transistor of the selection circuit 518 coupled to the input 520. More particularly, there may be leakage current in a transmission gate comprising a P-channel transistor coupled to the input 520, where current may leak from the source of the P-channel transistor to the bulk of the transistor. There may also be leakage in a path including the P-channel transistor between the input 520 and the input 521. By providing isolation between the interconnect element 516 transmitting the signal to the inverter 514 with the use of a gated reference voltage to the inverter 514, current leakage in the Die 2, such as current leakage in the selection circuit 518 can be reduced. It should be noted that the current leakage is generally between ungated and gated regions. In addition to current leakage, an actively turned on path results in current paths from ungated to gated regions, where isolation provided with a gated supply will turn off those current paths.

In order to enable the transfer the signal from the inverter 512 by way of the interconnect element 516 to other portions of the integrated circuit device, including other portions of the Die 2 or to a Die 3 of the stacked die arrangement of the integrated circuit device, additional elements are provided in the Die 2. For example, an inverter 528, which receives the reference voltage (e.g. VCCINT), and not a gated reference voltage (e.g. gated VCCINT), is provided to ensure that the signal provided to the Die 2 by way of the interconnect element 516 can be provided to other portions of Die 2 and to Die 3. The inverter 528 receives the signal generated at the interconnect element 516 and provides the signal to other circuit elements for routing the signal. For example, the other circuit elements may comprise a multiplexer 530 having an input 532 and an input 534 configured to receive the signal, which may be selected as a signal provided to the output 536 in response to a signal received at a selection input 537, which may be received from a memory element, which may be a CRAM memory cell 538 that receives a reference signal. The output 536 is coupled to an inverter 540, which receives the reference voltage Vref and provides an output to other portions of the integrated circuit device, such as other portions of Die 2 or a Die 3 541 by way of an interconnect element 542 enabling the transfer of signals to the Die 3. By providing the inverter 528 and the other elements enabling the transfer of signals from the interconnect element 516 to other portions of the integrated circuit, a signal from the Die 1 can be transferred to other portions of the integrated circuit device, which allows inverter 514 to be controlled by a gated reference voltage to avoid a defective portion of an integrated circuit and prevent current leakage in a device that may not be used, such as selection circuit 518.

The circuits and methods provide a benefit is there is a short circuit, such as a vccint-gnd short circuit on a die. If there is no power gating, the die would have to be discarded. However, by power gating, the short circuit translates to virtual vccint-gnd short, and it is therefore used to avoid vccint-gnd short. Vccint is a global supply which may be common to all dies in a stack, whereas virtual vccint is a local supply to that particular die. Any shorts on this local supply can be isolated from global external supply. Yield improves by avoiding the use of die which is defective. For example, if there is stack of 3 dies and there is a vccint-gnd short on one die, then it would be necessary to throw away a device having multiple dies without power gating where one of the die is defective. With power gating, the stack of 2 dies would still be functional.

Figure 6:
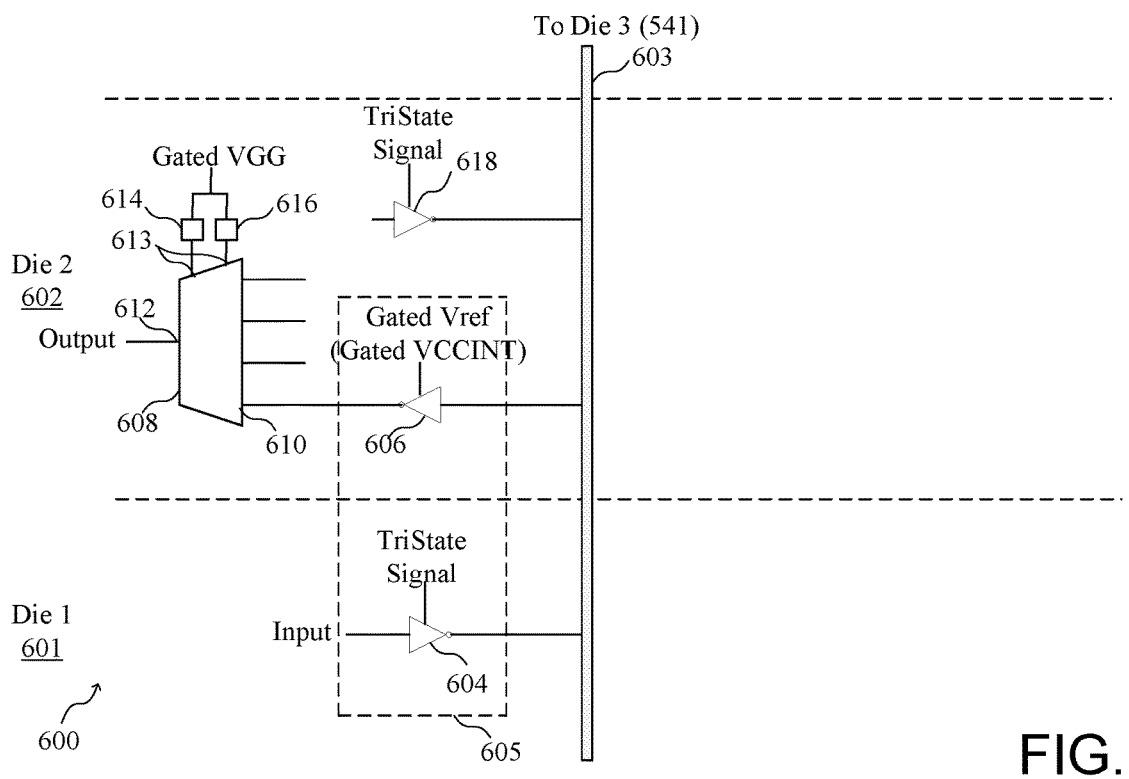
FIG. 6 is another block diagram of a portion of a circuit for transmitting signals between die of an integrated circuit device.

Turning now to FIG. 6, another block diagram of a portion of a circuit 600 for transmitting signals between stacked die of an integrated circuit device is shown. The circuit of FIG. 6 is similar to the circuit of FIG. 5, except that a pillar connection 603 extends between the dies 601 and 602, and tri-stated inverters are adapted to provide tri-state signals to and receive tri-state signals from a pillar connection. As shown in FIG. 6, an inverter 604 of a buffer 605 is configured to receive an input signal and is controlled by a tristate signal so that an output of the tri-state inverter may be floating if not sending a signal to the pillar connection. An output of the tristate inverter 604 is coupled to the pillar connection 603, which is also coupled to an inverter 606 to receive a signal from the pillar connection 603. The inverter 606 is controlled by a gated reference voltage and, along with inverter 604, form the buffer that is divided between Die 1 and Die 2. An output of the inverter 606 is coupled to a selection circuit 608 at an input 610. A selected input of the selection circuit 608 is generated at an output 612 in response to signals received at the control signal inputs 613. According to some implements, the signals provided to the control signal inputs may be from memory elements 614 and 616, which may be CRAM cells receiving a gated voltage, such as a gated VGG. Other tristate inverters, such as tristate inverter 618 may be coupled to the pillar connection 603 to enable the transfer of data from the inverter 604 to other portions of Die to or to Die 3. Delay can also be better controlled with split inverters with definite inverter load in case of pillared connection and provide a lower delay than a no-split solution.

Figure 7:
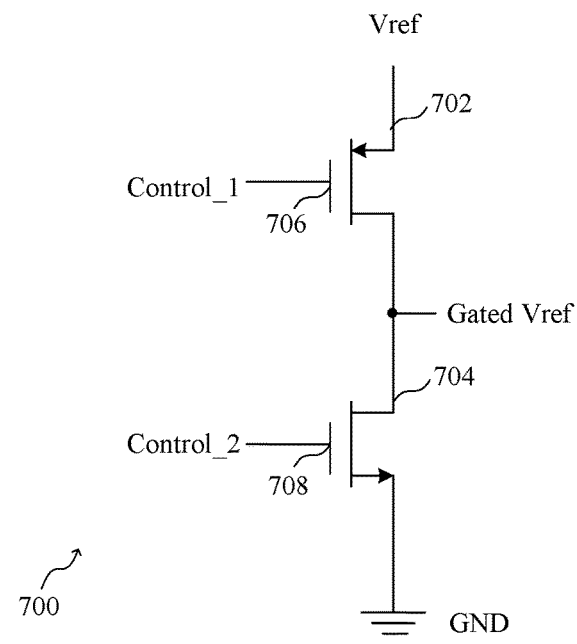
FIG. 7 is a block diagram of an exemplary gating circuit that could be implemented in the circuits of FIGS. 5 and 6.

Turning now to FIG. 7, a block diagram of an exemplary gating circuit 700 that could be implemented in the circuits of FIGS. 5 and 6 is shown. A gated reference voltage may be generated using a series of transistors coupled between the reference voltage Vref and ground. A p-channel transistor 702 has a source configured to receive the reference voltage and a drain coupled to a drain of the n-channel transistor 704. A first control signal (Control_1) is coupled to a gate 706 of the transistor 702, and a second control signal (Control_2) is coupled to a gate 708 of the transistor 704. The gated reference voltage (Gated Vref) can be generated at a node between the drains of the transistors 702 and 704 in response to the control signals. A particular example of generating a gated VGG signal will be described in reference to FIG. 8.

Figure 8:
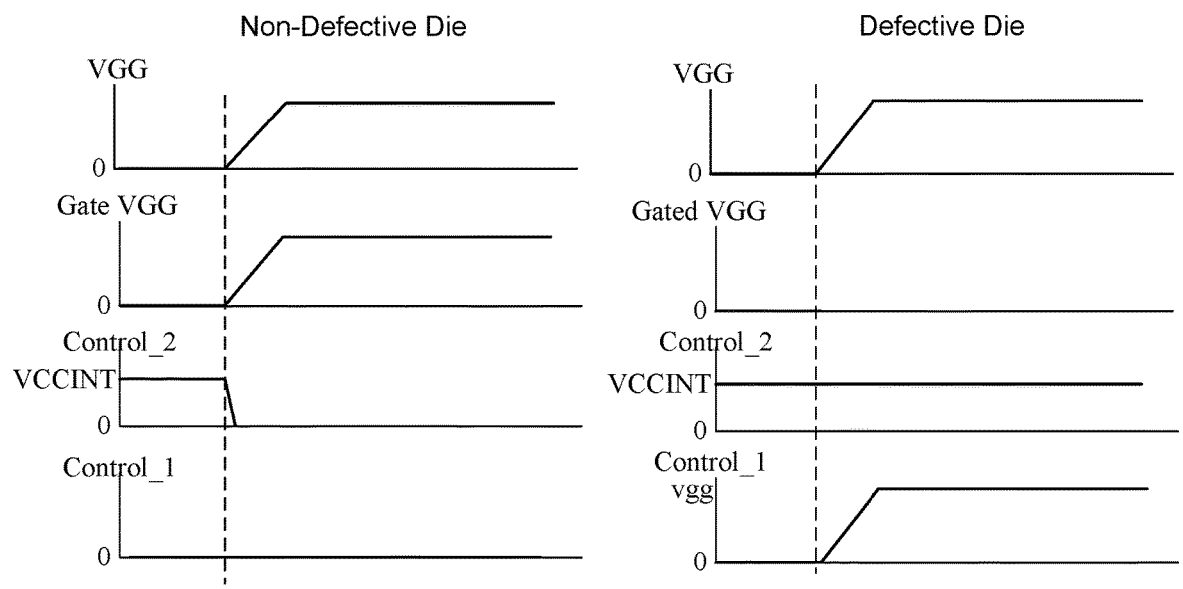
FIG. 8 is a timing diagram showing an operation of the gating circuit of FIG. 7.

Turning now to FIG. 8, a timing diagram shows an operation of the gating circuit of FIG. 7 to generate a gated VGG signal. For a non-defective die, the Control_1 signal remains low to keep the transistor 702 on. The Control_2 signal remains high until VGG turns on, and then goes low, allowing the Gated VGG signal to follow VGG. For a defective die, the Control_2 signal remain high, keeping transistor 704 on and the Gated VGG signal low. Control 1 follows the VGG signal.

In the case of a Defective die, both Control_1 and Control_2 are tied low. The Control_2 signal remains at Vccint and Control_1 is ramped up with Vgg. A pull-down circuit is provided on the Gated Vref signal (such as a gated VGG signal) during a startup to ensure wake up in known state. This can be accomplished by a Vccint controlled N-channel transistor 704. During a startup sequence, the transistor 704 initially remains on. Then depending on whether device is defective or not, the Vgg pass gate switch (transistor 704) will remain off or will be turned on.

Full VGG gating with isolation as described in FIGS. 5 and 6 is beneficial because, without these isolation inverters, it is not possible to perform VGG power gating as PMOS transistors in selection multiplexers will be turned on and there will be a current path if there are no isolation inverters. Further, better yields can be achieved, where shorts between a gated VGG and ground can be recovered.

Figure 9:
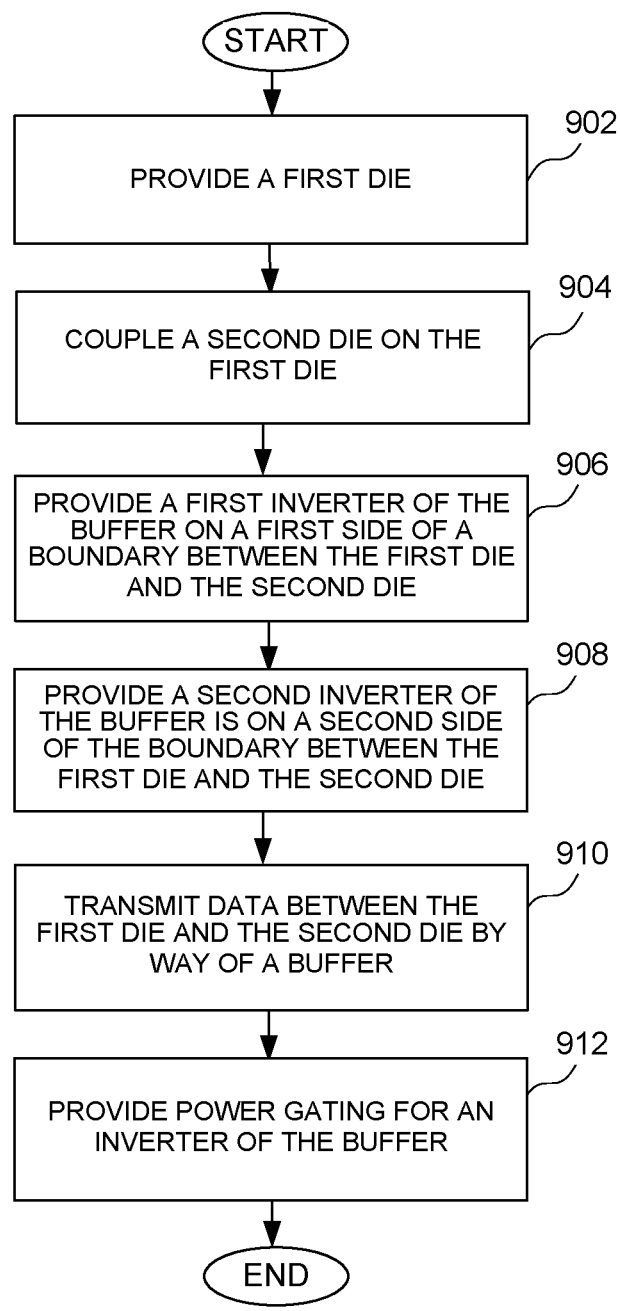
FIG. 9 is a flow chart showing a method of transmitting signals in an integrated circuit device.

Turning now to FIG. 9, a flow chart shows a method of transmitting circuits in an integrated circuit device; A first die, such as Die 1 of FIGS. 5 and 6, is provided at a block 902. A second die, such as Die 2 of FIG. 5 and FIG. 6, is coupled to the first die at a block 904. A first inverter of the buffer provided on a first side of a boundary between the first die and the second die as described above at a block 906. A second inverter of the buffer is provided on a second side of the boundary between the first die and the second die at a block 908. For example, the first and second inverters could be invertors 512 and 514 of FIG. 5 or invertors 604 and 606 of FIG. 6 for example. Data is transmitted between the first die and the second die by way of a buffer at a block 910. Power gating is provided for an inverter, such as the second inverter of the buffer at a block 912.

According to some implementations, the second inverter may be configured to receive a gated reference voltage based upon a reference voltage, wherein the first inverter is configured to receive the reference voltage. A third inverter may be implemented on the second die, wherein the third inverter is configured to receive the reference voltage. According to some implementations, the first inverter may comprise a tri-state inverter and is configured to receive a tri-state signal. The use of tri-state inverters may be beneficial for use with a pillar connection, as shown in FIG. 6 for example. Power gating circuits may be implemented according to various implementations, wherein a power gating circuit may be coupled to the first inverter of the buffer, and wherein a power gating circuit is configured to apply a gated reference signal to the first inverter. The second die may also comprise interconnect elements that are configured to receive a second gated reference voltage. The interconnect elements may comprise selection circuits having selection inputs configured to receive control signals from memory elements configured to receive the second gated reference voltage. The first inverter may be associated with an input/ output block of the first die and the second inverter is associated with an input/output block of the second die.

The method of FIG. 9 may be implemented using the circuits of FIGS. 1-8 and 10-11 as described, or using some other suitable circuits. While specific elements of the method are described, it should be understood that additional elements of the method, or additional details related to the elements, could be implemented according to the disclosure of FIGS. 1-9.

Figure 10:
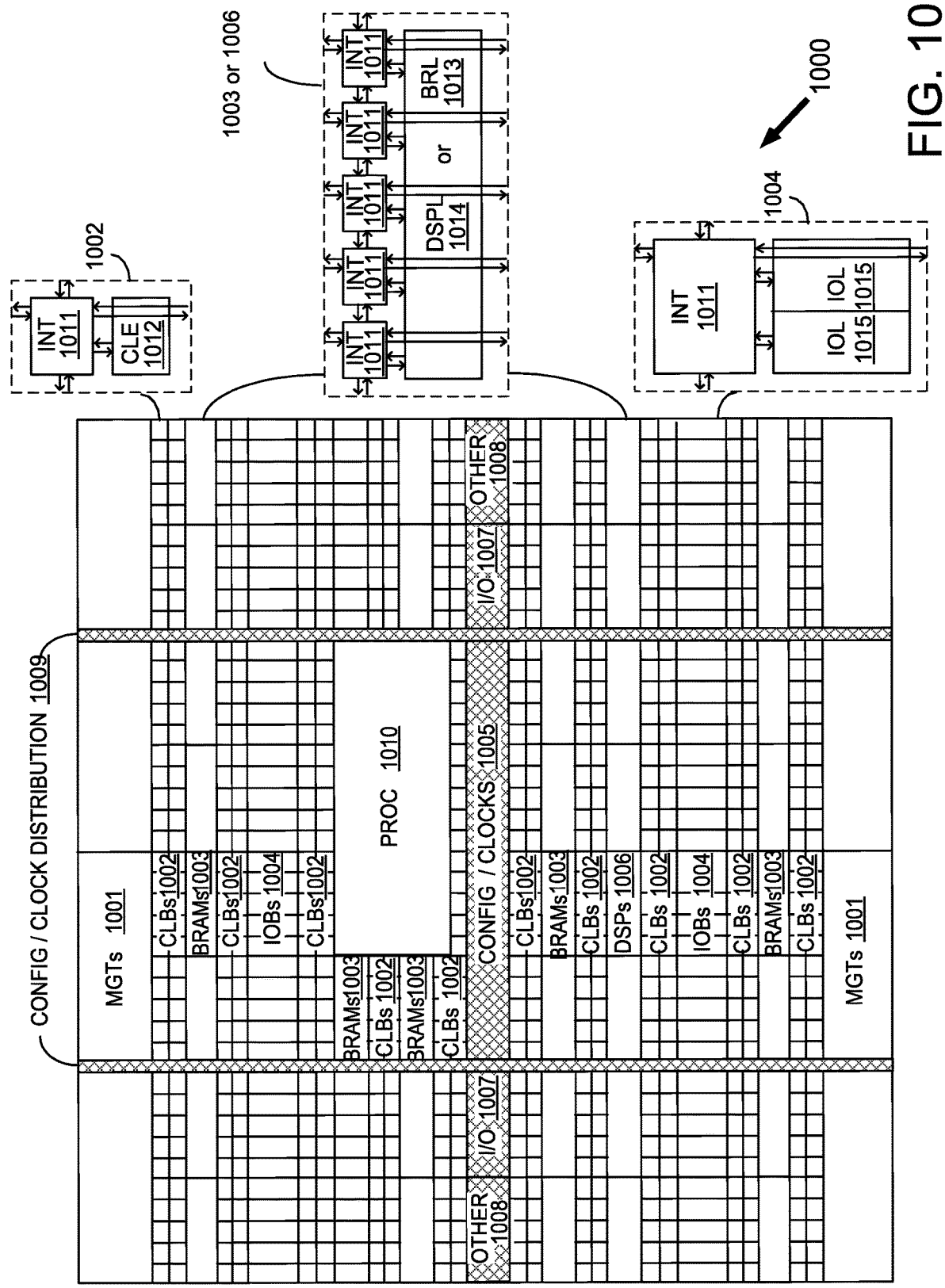
FIG. 10 is a block diagram of a programmable logic device that could implement the circuits and methods for transmitting signals in an integrated circuit device.

Turning now to FIG. 10, a block diagram of a programmable logic device is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream (or configuration data bits sent during a partial reconfiguration) provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 10 comprises an FPGA architecture 1000 having a large number of different programmable tiles including multi-gigabit transceivers (MGTs) 1001, CLBs 1002, random access memory blocks (BRAMs) 1003, input/output blocks (IOBs) 1004, configuration and clocking logic (CONFIG/CLOCKS) 1005, digital signal processing blocks (DSPs) 1006, specialized input/output blocks (I/O) 1007 (e.g., configuration ports and clock ports), and other programmable logic 1008 such as digital clock managers, analog-to-digital converters, system monitoring logic, and so forth. Some FPGAs also include dedicated processor blocks (PROC) 1010, which may be used to implement a software application, for example.

In some FPGAs, each programmable tile includes a programmable interconnect element (INT) 1011 having standardized connections to and from a corresponding interconnect element in each adjacent tile. Therefore, the programmable interconnect elements taken together implement the programmable interconnect structure for the illustrated FPGA. The programmable interconnect element 1011 also includes the connections to and from the programmable logic element within the same tile, as shown by the examples included at the top of FIG. 10.

For example, a CLB 1002 may include a configurable logic element (CLE) 1012 that may be programmed to implement user logic plus a single programmable interconnect element 1011. A BRAM 1003 may include a BRAM logic element (BRL) 1013 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 1006 may include a DSP logic element (DSPL) 1014 in addition to an appropriate number of programmable interconnect elements. An IOB 1004 may include, for example, two instances of an input/output logic element (IOL) 1015 in addition to one instance of the programmable interconnect element 1011. The circuits and methods could be implemented using the IOL 1015. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 1009 extending from this column are used to distribute the clocks and configuration signals across the breadth of the FPGA. Some FPGAs utilizing the architecture illustrated in FIG. 10 include additional logic blocks that disrupt the regular columnar structure making up a large part of the FPGA. The additional logic blocks may be programmable blocks and/or dedicated logic. For example, the processor block PROC 1010 shown in FIG. 10 spans several columns of CLBs and BRAMs.

Note that FIG. 10 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual FPGA more than one adjacent column of CLBs is typically included wherever the CLBs appear in order to facilitate the efficient implementation of user logic. While the implementation of FIG. 10 relates to an integrated circuit having programmable resources, it should be understood that the circuits and methods set forth above could be implemented in any type of device having a combination of programmable resources and hard blocks.

Figure 11:
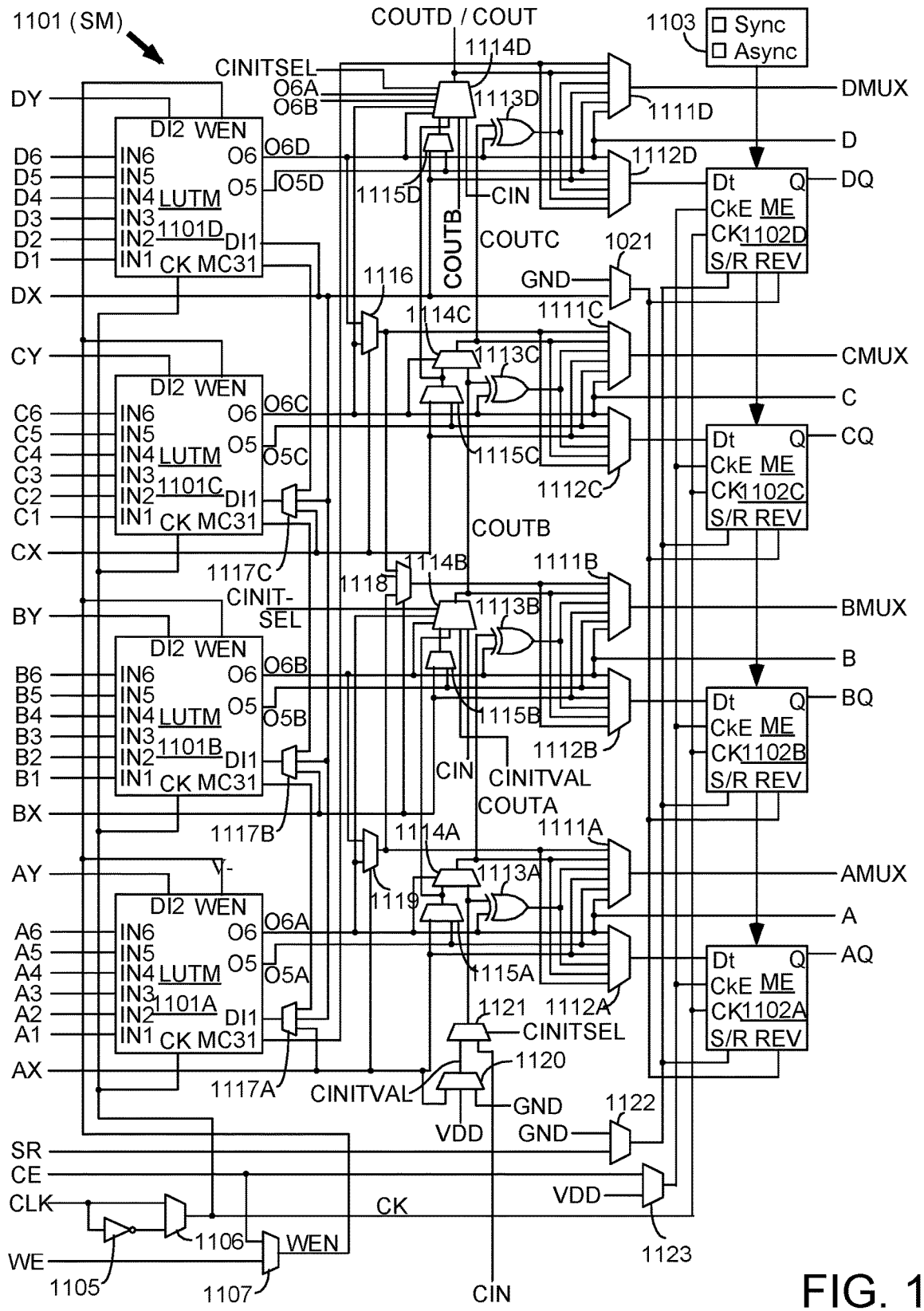
FIG. 11 a block diagram of a configurable logic element of the programmable logic device of FIG. 10.

Turning now to FIG. 11, a block diagram of a configurable logic element of the programmable logic device of FIG. 10 is shown. In particular, FIG. 11 illustrates in simplified form a configurable logic element, which is an example of Programmable Logic, of a configuration logic block 1002 of FIG. 10. In the implementation of FIG. 11, slice M 1101 includes four lookup tables (LUTMs) 1101A-1101D, each driven by six LUT data input terminals A1-A6, B1-66, C1-C6, and D1-D6 and each providing two LUT output signals O5 and O6. The 06 output terminals from LUTs 1101A-1101D drive slice output terminals A-D, respectively. The LUT data input signals are supplied by the FPGA interconnect structure via input multiplexers, which may be implemented by programmable interconnect element 1111, and the LUT output signals are also supplied to the interconnect structure. Slice M also includes: output select multiplexers 1111A-1111D driving output terminals AMUX-DMUX; multiplexers 1112A-1112D driving the data input terminals of memory elements 1102A-1102D; combinational multiplexers 1116, 1118, and 1119; bounce multiplexer circuits 1122-1123; a circuit represented by inverter 1105 and multiplexer 1106 (which together provide an optional inversion on the input clock path); and carry logic having multiplexers 1114A-1114D, 1115A-1115D, 1120-1121 and exclusive OR gates 1113A-1113D. All of these elements are coupled together as shown in FIG. 11. Where select inputs are not shown for the multiplexers illustrated in FIG. 11, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 11 for clarity, as well as from other selected figures herein.

In the pictured implementation, each memory element 1102A-1102D may be programmed to function as a synchronous or asynchronous flip-flop or latch. The selection between synchronous and asynchronous functionality is made for all four memory elements in a slice by programming Sync/Asynch selection circuit 1103. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1102A-1102D are clocked by a clock signal CK, which may be provided by a global clock network or by the interconnect structure, for example. Such programmable memory elements are well known in the art of FPGA design. Each memory element 1102A-1102D provides a registered output signal AQ-DQ to the interconnect structure. Because each LUT 1101A-1101D provides two output signals, O5 and O6, the LUT may be configured to function as two 5-input LUTs with five shared input signals (IN1-IN5), or as one 6-input LUT having input signals IN1-IN6.

In the implementation of FIG. 11, each LUTM 1101A-1101D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1117A-1117C for LUTs 1101A-1101C), or to the two 32-bit RAMs via input terminals DI1 and DI2. RAM write operations in the LUT RAMs are controlled by clock signal CK from multiplexer 1106 and by write enable signal WEN from multiplexer 1107, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1101A may also be provided to the general interconnect structure for shift register chaining, via output select multiplexer 1111D and CLE output terminal DMUX. Accordingly, the circuits and methods set forth above may be implemented in a device such as the devices of FIGS. 10 and 11, or any other suitable device.

It can therefore be appreciated that new circuits for and methods of transmitting signals in an integrated circuit device have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A circuit for transmitting signals in an integrated circuit device, the circuit comprising:
    a first die;
    a second die stacked on the first die; and
    a buffer transmitting data between the first die and the second die;
    wherein a first inverter of the buffer is on the first die, and a second inverter of the buffer is on the second die; and
    wherein the first inverter is configured to receive a reference voltage and the second inverter is configured to receive a gated reference voltage.

2. The circuit of claim 1, wherein the gated reference voltage is based upon the reference voltage.

3. The circuit of claim 2, further comprising a third inverter on the second die, wherein the third inverter is configured to receive an output of the first inverter and the reference voltage.

4. The circuit of claim 3, further comprising a third die stacked on the second die, wherein the third inverter is configured to transmit the data from the first die to the third die.

5. The circuit of claim 2, wherein the second die comprises interconnect elements that are configured to receive a second gated reference voltage.

6. The circuit of claim 5, wherein the interconnect elements comprise selection circuits having selection inputs configured to receive control signals from memory elements configured to receive the second gated reference voltage.

7. The circuit of claim 1, wherein the first inverter comprises a tri-state inverter and is configured to receive a tri-state signal.

8. The circuit of claim 7, wherein the first inverter and the second inverter are coupled to a pillar connection extending between the first die and the second die.

9. The circuit of claim 1, further comprising a power gating circuit coupled to the second inverter of the buffer, wherein the power gating circuit is configured to apply the gated reference voltage to the second inverter.

10. The circuit of claim 1, wherein the first inverter is associated with an input/output block of the first die and the second inverter is associated with an input/output block of the second die.

11. A method of transmitting signals in an integrated circuit device, the method comprising:
    providing a first die;
    stacking a second die on the first die;
    configuring a first inverter of a buffer to receive a reference voltage;
    configuring a second inverter of the buffer to receive a gated reference voltage; and
    transmitting data between the first die and the second die by way of the buffer;
    wherein the first inverter of the buffer is on the first die, and the second inverter of the buffer is on the second die.

12. The method of claim 11, wherein the gated reference voltage is based upon the reference voltage.

13. The method of claim 12, further comprising implementing a third inverter on the second die, wherein the third inverter is configured to receive the reference voltage.

14. The method of claim 13, further comprising stacking a third die on the second die, wherein the third inverter is configured to transmit the data from the first die to the third die.

15. The method of claim 12, further comprising configuring interconnect elements of the second die to receive a second gated reference voltage.

16. The method of claim 15, wherein configuring interconnect elements comprises configuring selection circuits having selection inputs coupled to receive control signals from memory elements configured to receive the second gated reference voltage.

17. The method of claim 11, wherein the first inverter comprises a tri-state inverter and is configured to receive a tri-state signal.

18. The method of claim 17, further comprising coupling the first inverter and the second inverter to a pillar connection extending between the first die and the second die.

19. The method of claim 11, further comprising coupling a power gating circuit to the second inverter of the buffer, wherein the power gating circuit is configured to apply the gated reference signal to the second inverter.

20. The method of claim 11, wherein the first inverter is associated with an input/output block of the first die and the second inverter is associated with an input/output block of the second die.

* * * * *